United States Patent [19]
Lee

[11] Patent Number: 6,154,414
[45] Date of Patent: Nov. 28, 2000

[54] SEMICONDUCTOR MEMORY DEVICE HAVING A PLURALITY OF MEMORY BLOCKS

[75] Inventor: Woo Young Lee, Kyoungki-do, Rep. of Korea

[73] Assignee: Hyundai Electronics Industries Co., Ltd., Kyoungki-do, Rep. of Korea

[21] Appl. No.: 09/317,211

[22] Filed: May 24, 1999

[30] Foreign Application Priority Data

May 27, 1998 [KR] Rep. of Korea ...................... 98-19342

[51] Int. Cl.⁷ .................................................. G11C 7/00
[52] U.S. Cl. ................... 365/230.03; 365/189.07; 365/230.01; 365/203; 365/204; 365/191
[58] Field of Search ................. 365/230.01, 230.03, 365/189.01, 189.07, 203, 204, 191

[56] References Cited

U.S. PATENT DOCUMENTS

| | | |
|---|---|---|
| 5,337,283 | 8/1994 | Ishikawa .................................. 365/222 |
| 5,457,655 | 10/1995 | Savignac et al. ........................ 365/200 |
| 5,574,688 | 11/1996 | McClure et al. ......................... 365/200 |
| 5,617,348 | 4/1997 | Maguire ..................................... 365/49 |
| 5,619,470 | 4/1997 | Fukumoto ................................ 365/228 |
| 5,673,232 | 9/1997 | Furutani .................................. 365/226 |
| 5,745,427 | 4/1998 | Freyman et al. .................... 365/230.01 |
| 5,761,146 | 6/1998 | Yoo et al. ........................... 365/230.03 |
| 5,864,508 | 1/1999 | Takashima et al. ............... 365/189.11 |
| 5,949,736 | 9/1999 | Sugita ................................ 365/230.06 |

*Primary Examiner*—Viet Q. Nguyen
*Attorney, Agent, or Firm*—Nath & Associates PLLC; Gary M. Nath; Harold L. Novick

[57] ABSTRACT

A semiconductor memory device has a plurality of memory blocks. The semiconductor memory device pre-charges a memory block when a block address signal applied to the memory block is identical with a previous block address signal previously applied, and activates the memory block when the block address signal is not identical with the previous block address signal. As a result, a pre-charge operation of a previous block and an activation operation of a present block are simultaneously performed so that the operation speed of an entire system becomes high-speed.

2 Claims, 3 Drawing Sheets

SEMICONDUCTOR MEMORY DEVICE HAVING A PLURALITY OF MEMORY BLOCKS

BACKGROUND OF THE INVENTION

1. Field of the Invention

The present invention relates to a semiconductor memory device having a plurality of memory blocks which achieves a high-speed operation by reducing a pre-charge time during an active operation of a word line. More particularly, it relates to a semiconductor memory device which pre-charges other blocks simultaneously while activating a previously activated block, thereby preventing the waste of a pre-charge time.

2. Description of the Prior Art

Generally, a semiconductor memory device is a logic element having a square-type matrix structure storing an electric digital signal therein, and has an address for designating each storage position. These addresses are called a row address and a column address, respectively.

The memory cells having a two-dimensional matrix structure of the square-type include a word line and a bit line on which data of a designated word line is output. Herein, an address of designating the word line is called a row address, and an address of designating the bit line is called a column address.

Hereinafter, a method for inputting/outputting data to a corresponding address in a DRAM will be described.

First, if a signal /RAS (i.e., /row address strobe) is activated as a low value and a row address is applied at the same time, one word line in a two-dimensional square-type memory structure is activated, thereby activating a plurality of cells connected to the word line. Minute electric signals of the cells connected to the word line once activated are amplified by an operation of a sense-amp and are then outputted.

After that, if the operation of the sense-amp is completed, one cell is selected by an operation of a column address signal applied in response to an activation of a signal /CAS (i.e., /column address strobe), and data of the selected cell is outputted to the outside.

However, the memory cells have a block structure in which a plurality of cells involved in the same block by an address designation is under the control of the same sense-amp and is simultaneously operated regardless of a data input/output operation. An address for designating a blocked unit block is called a block address, and this block address is selected among row addresses.

Accordingly, in case that one word line among the memory cells having the above block structure is activated, one column is designated, and a data output operation is achieved, the selected row address becomes pre-charged and returns to an inactive state. At this time, the time required from a command designating a precharge state to a completion of the precharge state is called a time tRP in a product specification.

However, since the conventional art arranges a most significant bit (MSB) in designating the block address, the block address is hardly changed during memory connection time. To reactivate other word lines involved in the same block after activating one word line, the time tRP should be elapsed. That is, since the conventional art has the following operation method, (i.e., a successive word line activation → read or write operation → a wait state during a pre-charge time → the next word line activation → read or write operation → a wait state during a pre-charge time, . . . ), unnecessary wait time is needed at intervals during a memory connection, thereby preventing a high-speed operation.

FIG. 1 is a timing diagram illustrating an operation of the conventional dynamic random access memory (DRAM). FIG. 1 shows that the time for pre-charging a previous word line is required before other word lines are activated, after performing a read operation by an activation of one word line involved in the same block. Accordingly, the time tRP required from a command designating a pre-charge state to a completion of the pre-charge state is positively needed in the conventional DRAM.

In case of a synchronous DRAM having a bank structure, if other banks are alternately activated and a ping-pong operation is performed, the aforementioned problem regarding the waste of the time tRP is capable of being solved. But, in case of a chip-set not supporting such a ping-pong operation of the bank structure or a general DRAM (i.e., standard DRAM), a high-speed operation of an entire system is prevented due to the time tRP.

SUMMARY OF THE INVENTION

Accordingly, the present invention is directed to a semiconductor memory device having a plurality of memory blocks that substantially obviates one or more of the problems due to limitations and disadvantages of the related art.

It is an object of the present invention to provide a semiconductor memory device which pre-charges other blocks simultaneously while activating a previously activated block, removes the time required for the pre-charge operation and being unnecessarily wasted, and achieves a high-speed operation. To achieve the above object, in a semiconductor memory device having a plurality of memory blocks of which operations are controlled by a block address signal, each memory block includes: a first storage means for receiving a first block address signal and storing it; a second storage means for receiving the first block address signal generated from the first storage means and storing it if a second block address signal is input; a comparing means which receives the second block address signal stored in the first storage means and the first block address signal stored in the second storage means, compares the second block address signal with the first block address signal, and determines whether or not the second block address signal is identical with the first block address signal; and a block activation means which pre-charges the memory block when the first block address signal is identical with the second block address signal, and activates the memory block when the first block address signal is not identical with the second block address signal.

The first storage means and the second storage means are enabled by a row address strobe (RAS) signal.

Additional features and advantages of the invention will be set forth in the following description, and in part will be apparent from the description, or may be learned by practice of the invention. The objective and other advantages of the invention will be realized and attained by the structure particularly pointed out in the written description and the claims hereof as well as in the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 2:
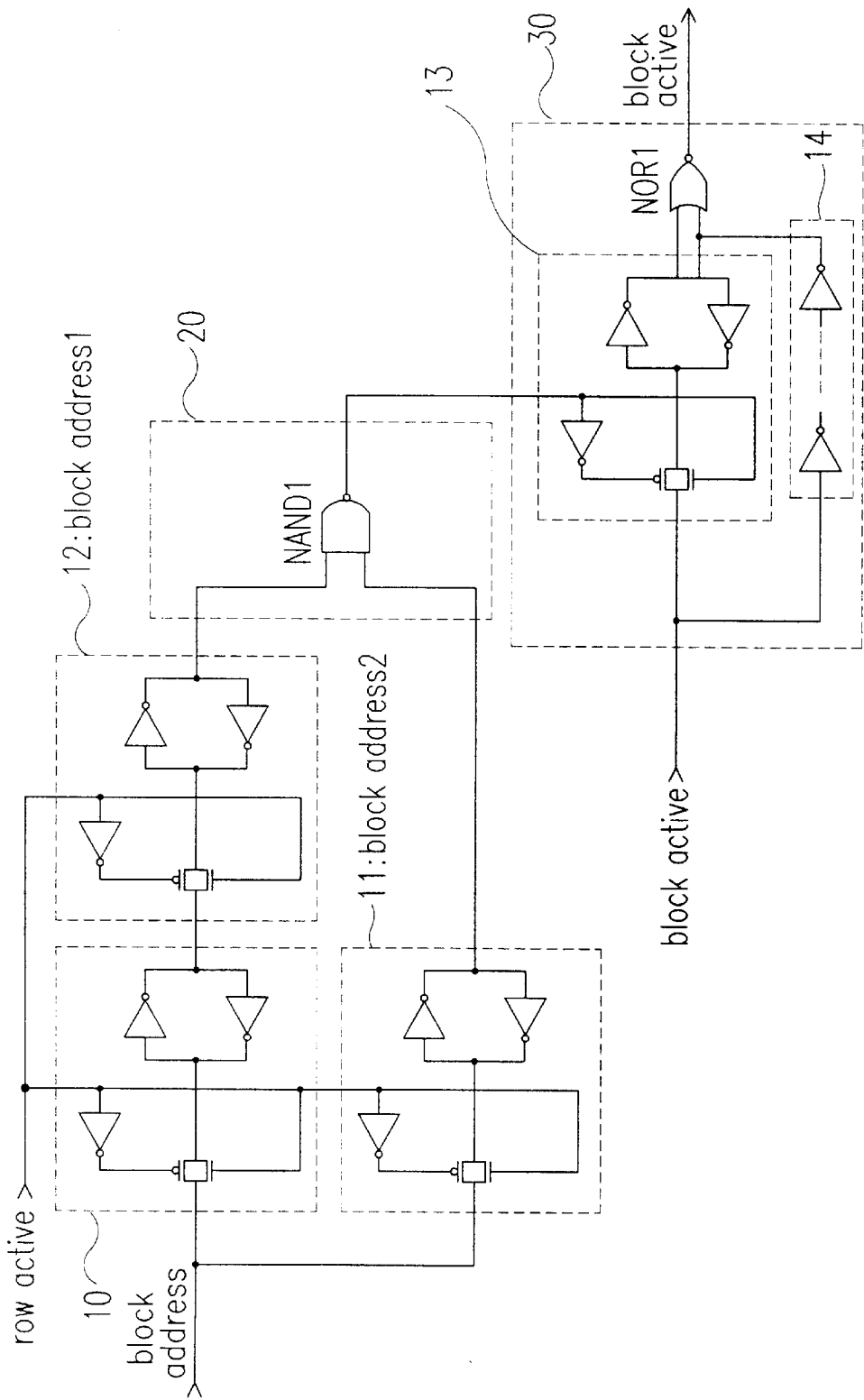
FIG. 2 is a circuit diagram illustrating a memory block selection circuit according to the present invention.

FIG. 2 is a circuit diagram illustrating a memory block selection circuit according to the present invention.

As shown in FIG. 2, the memory block selection circuit includes: first and second shift registers 10 and 11 for receiving a block address signal BLOCK ADDRESS and storing it if a row address strobe (RAS) signal is enabled; third shift register 12 which shifts a previous block address signal stored in the first shift register 10 when the next block address signal BLOCK ADDRESS is input after a predetermined time, and storing the previous block address signal; a comparing section 20 comprised of a NAND gate NAND1, which receives a present block address signal BLOCK ADDRESS2 stored in the second shift register 11 and a previous block address signal BLOCK ADDRESS1 shifted from the first shift register 10 and stored in the third shift register 12, compares the present block address signal BLOCK ADDRESS2 with the previous block address signal BLOCK ADDRESS1, determines whether or not the present block address signal BLOCK ADDRESS2 is identical with the previous block address signal BLOCK ADDRESS1, and generates different values; and a block activation section 30 which selectively delays an activation of the present block according to an output signal of the comparing section 20, and determines an activation of the present block and a sameness of a pre-charge timing of previous block.

The block activation section 30 includes: a shift register 13 which is controlled by an output signal of the comparing section 20, selectively receives a block activation signal BLOCK ACTIVE as an input, and stores the block activation signal BLOCK ACTIVE; an inverter chain 14 for delaying the block activation signal BLOCK ACTIVE during a predetermined time; and a NOR gate NOR1 which receives a signal stored in the shift register 13 and a signal delayed by the inverter chain 14, performs a logic operation about them, and thus selectively enables the block activation signal BLOCK ACTIVE.

The shift registers 10–13 include: a transmission gate for selectively transmitting a block address signal BLOCK ADDRESS by a signal ROW ACTIVE; and a latch circuit having two inverters whose input and output terminals of latching an output signal of the transmission gate are connected to each other.

Operations of the present invention will now be described below.

A block address signal of a previously activated block is first stored. As for the block address signal BLOCK ADDRESS1 stored in the first and second shift registers 10 and 11, in case that another block address signal BLOCK ADDRESS2 is input, the previous block address signal BLOCK ADDRESS1 stored in the first shift register 10 is shifted to the third shift register 12 and stored thereto, and a present input block address signal BLOCK ADDRESS2 is stored in the first and second shift registers 10 and 11.

By the aforementioned method, in case that the comparing section 20 determines that the previous block address signal BLOCK ADDRESS1 stored in the third shift register 12 is identical with the present block address signal BLOCK ADDRESS2 stored in the second shift register 11, that is, in case that it is determined that the same block is activated again, an output signal of the NAND gate NAND1 becomes a low signal, the transmission gate comprising the shift register 13 of the block activation section 30 turns off because the block activation signal should be delayed to ensure a pre-charge time, a time delay is obtained by the inverter chain 14, and a block activation signal BLOCK ACTIVE is then generated.

However, if the two block address signals BLOCK ADDRESS1 and BLOCK ADDRESS2 are different from each other, that is, if other than the previous block is activated, a present block is activated simultaneously with pre-charging the previously activated block. Therefore, the conventional problem regarding the waste of the time tRP shown in FIG. 1 can be solved, and a high-speed operation can be achieved.

At this time, a pre-charge signal informing a pre-charge of the previous block is generated simultaneously with an activation signal of the present block. If necessary, a control per block is possible.

Figure 3:
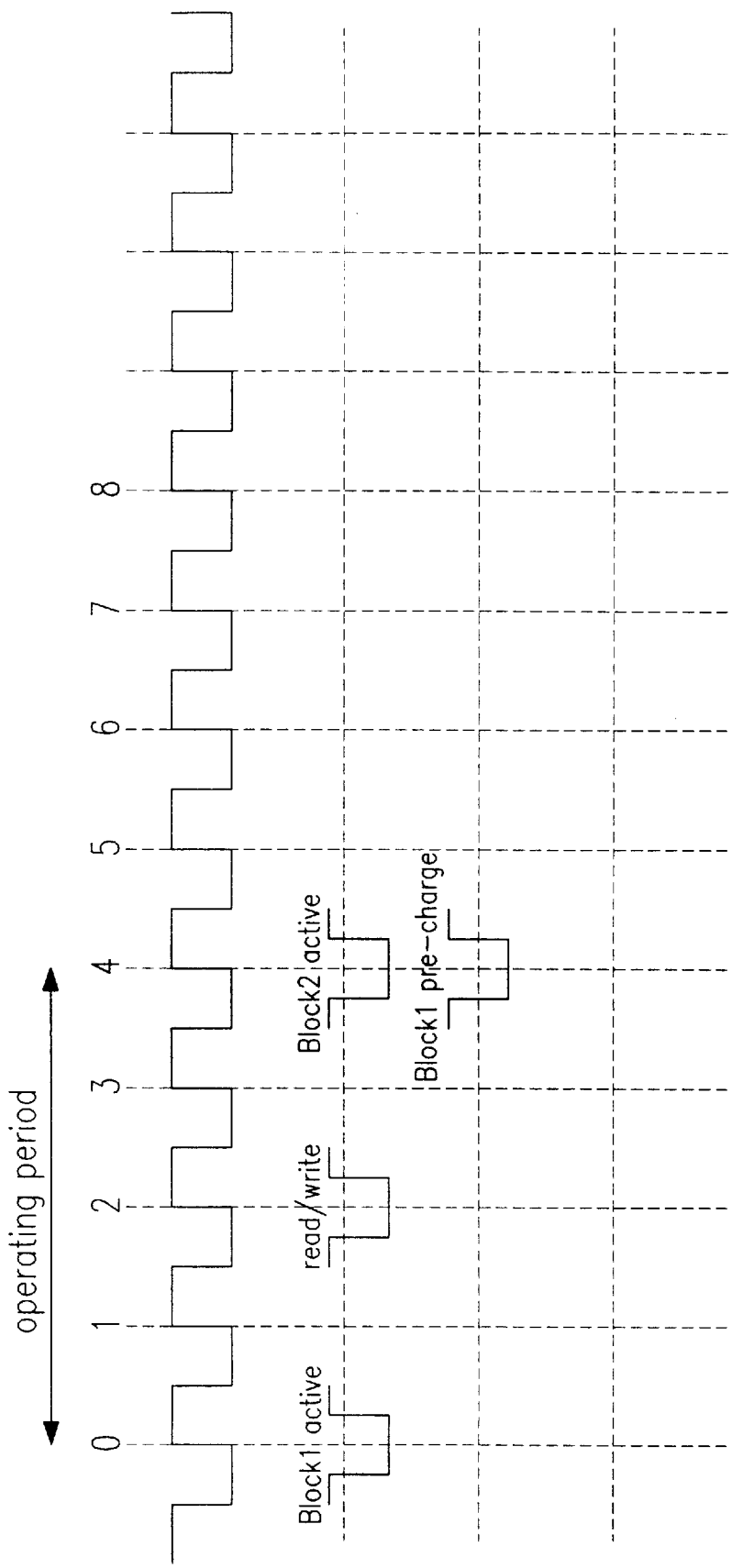
FIG. 3 is a timing diagram illustrating an operation of the circuit shown in FIG. 2 according to the present invention.

FIG. 3 is a timing diagram illustrating an operation of a high-speed DRAM according to the present invention.

Figure 1:
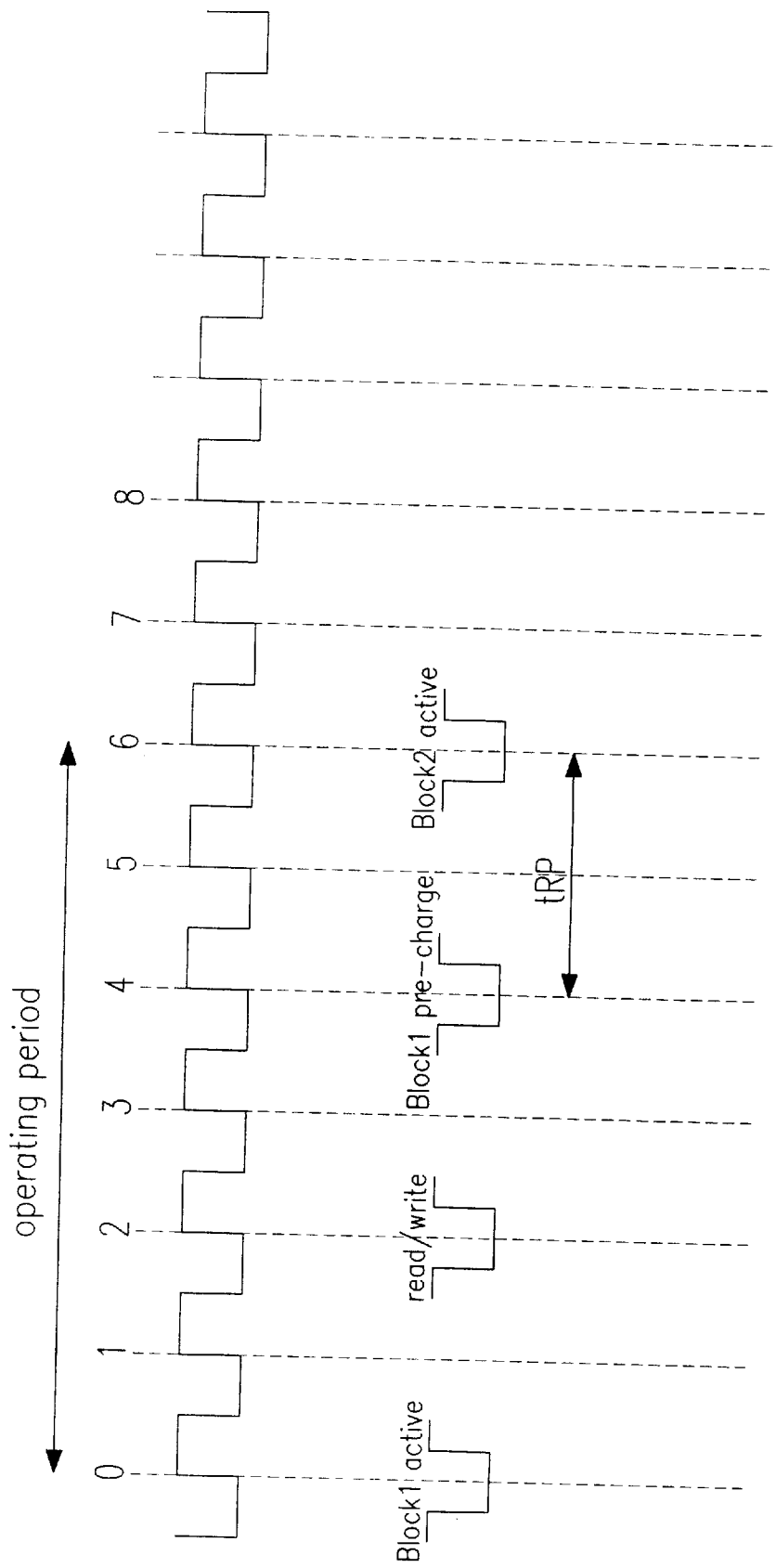
FIG. 1 is a timing diagram illustrating an operation of the conventional DRAM.

As shown in FIG. 3, if two block address signals different from each other are input, an operation of pre-charging a previous block and an operation of activating a present block are simultaneously performed at a fourth clock. In other words, the entire operation time of the prior art corresponds to six clocks as shown in FIG. 1, and an entire operation time of the present invention corresponds to four clocks as shown in FIG. 3. In conclusion, the entire operation time of the present invention is reduced by two clocks as compared with the prior art.

As described above, according to the high-speed DRAM of the present invention, a pre-charge operation of a previous block and an activation operation of a present block are simultaneously performed, so that the operation speed of an entire system becomes high-speed.

In addition, such high-speed operation is more conspicuous in the conventional DRAM element or a chip-set device not supporting a ping-pong operation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of the novelty that reside in the present invention, including all features that would be treated as equivalents thereof by those skilled in the art to which this invention pertains.

What is claimed is:

1. A semiconductor memory device having a plurality of memo locks of which operations are controlled by a block address signal, each memory block comprising:
   a first storage means for receiving a first block address signal and storing it;
   a second storage means for receiving the first block address signal generated from the first storage means and storing it if a second block address signal is input;
   a comparing means which receives the second block address signal stored in the first storage means and the first block address signal stored in the second storage means, compares the second block address signal with the first block address signal, and determines whether or not the second block address signal is identical with the first block address signal; and a block activation means which pre-charges the memory block when the first block address signal is identical with the second block address signal, and activates the memory block when the first block address signal is not identical with the second block address signal.

2. A semiconductor memory device having a plurality of memory blocks as set forth in claim 1, wherein the first storage means and the second storage means are enabled by a row address strobe signal.

* * * * *

UNITED STATES PATENT AND TRADEMARK OFFICE
CERTIFICATE OF CORRECTION

PATENT NO.    : 6,154,414
DATED         : November 28, 2000
INVENTOR(S)   : Woo Young Lee It is certified that error appears in the above-identified patent and that said Letters Patent is hereby corrected as shown below:

Replace Claim 1 with the following:

1. A semiconductor memory device having a plurality of memory blocks of which operations are respectively controlled by a plurality of block address signals, each memory bolck comprising:
  a first storage means for receving the plurality of block address signals in sequence and a second storage means, wherein when the first storage means stores a first block address signal, the first storage means shifts the first block address signal into the second storage means and stores a second block address signal, in response to the second block address signal;
  the second storage means for receiving the shifted first block address signal from the first storage means and storing the first block address signal;
  a comparing means which receives the second block address signal stored in the first storage means and the first block address signal stored in the second storage means, compares the second block address signal stored in the first storage means with the first block address signal stored in the second storage means, and determines whether or not the second block address signal stored in the first storage means is identical with the first block address signal stored in the second storage means; and
  a block activation means which precharges at least one of the plurality of memory blocks when the first block address signal stored in the second storage means is identical with the second block address signal stored in the first storage means and activates at least one of said plurality of memory blocks when the first block address signal stored in the second storage means is not identical with the second block address signal stored in the first storage means.

Signed and Sealed this

Second Day of October, 2001

Attest:

NICHOLAS P. GODICI
Attesting Officer        Acting Director of the United States Patent and Trademark Office